(12) United States Patent
Stothers et al.

(10) Patent No.: US 12,061,168 B2
(45) Date of Patent: Aug. 13, 2024

(54) DETECTING DELAMINATION IN A LAMINATED STRUCTURE

(71) Applicant: Ultra Electronics Limited, London (GB)

(72) Inventors: Ian Stothers, London (GB); Amir Mahdiani, London (GB); Jonathan Newton, London (GB)

(73) Assignee: Ultra PCS Limited, Cheltenham (GB)

( * ) Notice: Subject to any disclaimer, the term of this patent is extended or adjusted under 35 U.S.C. 154(b) by 118 days.

(21) Appl. No.: 17/911,892

(22) PCT Filed: Mar. 16, 2021

(86) PCT No.: PCT/EP2021/056730
§ 371 (c)(1),
(2) Date: Sep. 15, 2022

(87) PCT Pub. No.: WO2021/185867
PCT Pub. Date: Sep. 23, 2021

(65) Prior Publication Data
US 2023/0141480 A1    May 11, 2023

(30) Foreign Application Priority Data
Mar. 16, 2020 (GB) ...................... 2003776

(51) Int. Cl.
*G01N 27/82* (2006.01)
(52) U.S. Cl.
CPC .................. *G01N 27/82* (2013.01)

(58) Field of Classification Search
CPC ........ G01N 27/02; G01N 27/20; B64D 45/00; G01R 15/183; G01R 19/10; G01R 31/52
See application file for complete search history.

(56) References Cited

U.S. PATENT DOCUMENTS

| 7,580,777 | B2 | 8/2009 | Smith et al. | |
| 8,517,601 | B2 * | 8/2013 | Stothers | B64D 15/20 |
| | | | | 374/45 |
| 9,919,812 | B2 * | 3/2018 | Shi | G08B 21/182 |
| 2009/0149997 | A1 | 6/2009 | Stothers | |
| 2009/0230239 | A1 | 9/2009 | Stothers | |
| 2010/0243811 | A1 | 9/2010 | Stothers | |

(Continued)

FOREIGN PATENT DOCUMENTS

| AU | 2010202580 B2 | 1/2011 |
| DE | 10 2014 219 869 A1 | 3/2016 |

(Continued)

*Primary Examiner* — Dominic E Hawkins
(74) *Attorney, Agent, or Firm* — Blank Rome LLP (57) ABSTRACT

We describe a way of detecting delamination of a laminated structure that is heated by DC powered heaters by passing the source and return wires that supply current to the heaters through a toroidal transformer core. Should there be a breakdown in the laminations, current flowing through the heater will flow into the structure, resulting in less current being present in the return wire than in the source wire. The current imbalance between the source and return wires causes the transformer core to saturate. Using the core saturation, caused by the DC current imbalance, the delamination (or imminent delamination) of the laminated structure can be detected.

21 Claims, 6 Drawing Sheets

(56) References Cited

U.S. PATENT DOCUMENTS

| | | | |
|---|---|---|---|
| 2012/0206151 A1* | 8/2012 | Leonov | G01N 27/90 324/546 |
| 2015/0016006 A1 | 1/2015 | Van Vroonhoven et al. | |
| 2017/0168021 A1* | 6/2017 | Van Tooren | B64F 5/60 |
| 2018/0258916 A1* | 9/2018 | Sawada | F03D 17/00 |

FOREIGN PATENT DOCUMENTS

| | | | |
|---|---|---|---|
| EP | 0 627 630 A2 | 12/1994 | |
| EP | 2 267 465 A1 | 12/2010 | |
| EP | 3006928 | 4/2016 | |
| GB | 2483530 A * | 3/2012 | B64D 15/12 |
| GB | 2526569 | 12/2015 | |
| GB | 2561393 A | 10/2018 | |
| WO | WO 2008/145985 A2 | 12/2008 | |
| WO | WO 2012/141779 A1 | 10/2012 | |

\* cited by examiner

Fig. 1

HEATER ZONE

DETECTING DELAMINATION IN A LAMINATED STRUCTURE

FIELD OF THE INVENTION

The present invention relates to an apparatus and method for detecting delamination in a laminated structure.

BACKGROUND OF THE INVENTION

Many modern structures comprise composite materials that comprise a plurality of layers of stiff material bound together with glue. Composite materials have a good ratio of strength to weight, but are susceptible to failure by delamination, this may be due to, for example, manufacturing defects or when the glue bonding the different layers melts, which can occur even at a relatively low temperatures.

One such application of composite structures is to vehicles, for example aircraft. In such vehicles, delamination of a laminated structure during use of the vehicle could be catastrophic. Sometimes portions of the aircraft structures are required to be heated, for example to prevent ice forming on the structure, or to shed ice that has already formed on the structure. Since heaters are in direct contact with the laminated structure, it is important that the heater does not over heat the structure.

However, should the heater over heat the structure, there is a need to detect that the structure is or has started to delaminate so that action may be taken. This is especially difficult to do in modern aircraft where DC power buses are used to power the heaters instead of the older AC voltage systems of older craft.

SUMMARY OF THE INVENTION

The present invention provides an apparatus and method for detecting delamination in a laminated structure in accordance with the appended independent claims. Advantageous embodiments may be found in the dependent claims appended hereto.

In particular, the present invention therefore provides an apparatus for detecting delamination in a laminated structure, the laminated structure comprising a plurality of laminated layers, the apparatus comprising: one or more heaters mechanically and thermally connected to the laminated structure for heating the laminated structure, the one or more heaters being disposed between first and second ground layers within the laminated structure; a controller electrically coupled to the one or more heaters via source and return wires, the controller being configured to supply the one or more heaters with a DC current through the source and return wires to heat the one or more heaters; a magnetically saturable closed loop transformer core, the source and return wires carrying the DC current passing through the transformer core; and a delamination sensor coupled to the transformer core for detecting a DC current imbalance in the source and return wires, wherein the delamination sensor detects delamination in the laminated structure upon detection of a DC current imbalance in the source and return wires.

Advantageously, using the apparatus described above enables delamination in a laminated structure to be detected and acted upon before the damage becomes catastrophic.

The delamination sensor may comprise: a sensor source winding coupled to the transformer core and receiving an AC sensor voltage; a detector winding coupled to the transformer core; and an AC voltage sensor coupled to the detector winding for detecting an AC voltage on the detector winding through transformer coupling with the sensor source winding. Delamination of the laminated structure may be detected when the sensor detects a change in the AC voltage.

Delamination of the laminated structure may be detected when the sensor detects a decrease in the magnitude of the AC voltage detected on the detector winding, and/or when the sensor detects a change in the shape of the AC voltage on the detector winding. The AC voltage input to the sensor source winding may be compared with the AC voltage detected on the detector winding.

In an alternative design, the delamination sensor may comprise: a sensor winding coupled to the transformer core, the sensor winding having a first end and a second end, the second end being connected to ground, the sensor winding for sensing a change in the magnetic flux density in the transformer core; an impedance component having a known impedance and having a first end and a second end, the first end being connected to the first end of the sensor winding; a signal generator connected to the second end of the impedance component for generating an AC electrical signal for application to the impedance component and sensor winding; an analogue-to-digital converter for receiving an electrical signal and for generating a digital voltage signal; a switch having a first end connected to switch alternately between the first end of the impedance component and the second end of the impedance component, and the switch having a second end connected to the analogue-to-digital converter; and a processor connected to the analogue-to-digital converter for receiving a digital voltage signal and for generating a sensor signal, wherein the processor is adapted to control the switch to connect to the first and second ends of the impedance component sequentially, wherein delamination of the laminated structure is detected dependent on the sensor signal. The impedance component may comprise a resistor or an inductor.

The signal generator may be adapted to generate the AC electrical signal comprising sequential signal blocks for application to the series connected impedance component and sensor winding, and wherein the switch is adapted to switch to connect the analogue-to-digital converter to measure each of the voltages generated at the first and second ends of the impedance component during the same part of the signal block of sequential signal blocks of the signal. The signal generator may include a digital store storing a signal pattern for at least a part of the signal block, generator means for generating a digital signal by repeatedly using the stored signal pattern, and a digital-to-analogue converter for converting the digital signal to the AC electrical signal. The signal generator and the processor may be adapted to operate synchronously.

In this alternative design, it may comprise a plurality of Analogue to Digital Converters, each for receiving an electrical signal and for generating a digital voltage signal, wherein the switch is adapted to switch each of the plurality of Analogue to Digital Converters sequentially to measure the voltages to allow simultaneous measurements of the voltages, and the processor is adapted to process the sequentially measured voltages for each of the Analogue to Digital Converters. The processor may comprise a digital processing arrangement, and the outputs of the plurality of Analogue to Digital Converters are input into a common multiplexer connected to the processor.

In this alternative design, the delamination sensor may be adapted to generate an output as a measure of impedance or at least one component of the impedance of the sensor winding. The delamination sensor may be adapted to determine delamination of the laminated structure dependent on the measure of impedance or at least one component of the impedance of the sensor winding is above or below a threshold.

In a further alternative design, the delamination sensor may comprise: a sensor winding coupled to the transformer core, the sensor winding having a first end and a second end, the sensor winding for sensing a change in the magnetic flux density in the transformer core; an AC voltage source connected to the first end of the sensor winding for generating a square wave AC electrical signal for application to the sensor winding; an AC voltage sensor coupled to the first or second end of the sensor winding for detecting an AC voltage on the sensor winding; and an AC current sensor coupled to the first or second end of the sensor winding for detecting an AC current in the sensor winding.

Delamination of the laminated structure may be detected when the delamination sensor detects a change in the AC voltage or AC current. The detected AC voltage on the sensor winding may be low-pass filtered, and wherein delamination of the laminated structure may be detected when the delamination sensor detects a change in a low-pass filtered AC voltage that is greater than a threshold change.

The AC voltage source may be a bipolar excitation source whose polarity is reversed when the AC current in the sensor winding reaches a threshold value, and wherein delamination of the laminated structure may be detected when the delamination sensor detects a change in the frequency of the AC voltage on the sensor winding that is greater than a threshold change.

The transformer core in any of the above designs may be a transformer core having a relative permeability that is greater than 1000, and/or wherein the transformer core is a toroidal transformer core.

In any of the above designs, for two or more heaters, each of the two or more heaters may comprise a return wire, and each of the return wires pass through the transformer core.

The present invention also provides a method of detecting delamination in a laminated structure, the method comprising: arranging one or more heaters to be mechanically and thermally connected to the laminated structure between first and second ground layers within the laminated structure, providing a controller electrically coupled to the one or more heaters via source and return wires, the controller being configured to supply the one or more heaters with a DC current through the source and return wires to heat the one or more heaters; arranging the source and return wires of the one or more heaters to pass through a magnetically saturable closed loop transformer core; supplying one or more heaters with a DC current through the source and return wires to heat the one or more heaters; coupling a delamination sensor to the transformer core for detecting a DC current imbalance in the source and return wires; and using the delamination sensor to detect delamination in the laminated structure by detecting a DC current imbalance in the source and return wires.

The delamination sensor may comprise: a sensor source winding coupled to the transformer core and receiving an AC sensor voltage; a detector winding coupled to the transformer core; and an AC voltage sensor coupled to the detector winding and the method comprises: providing an AC sensor voltage on the sensor source winding; and detecting an AC voltage on the detector winding using the AC voltage sensor. Delamination of the laminated structure may be detected when the sensor detects a change in the AC sensor voltage. Delamination of the laminated structure may be detected when the sensor detects a decrease in the magnitude of the AC voltage detected on the detector winding, or when the sensor detects a change in the shape of the AC voltage on the detector winding.

The method may comprise comparing the AC voltage input to the sensor source winding with the AC voltage detected on the detector winding.

In an alternative method, the delamination sensor may comprise: a sensor winding coupled to the transformer core, the sensor winding having a first end and a second end, the second end being connected to ground, the sensor winding for sensing a change in the magnetic flux density in the transformer core; an impedance component having a known impedance and having a first end and a second end, the first end being connected to the first end of the sensor winding; a signal generator connected to the second end of the impedance component for generating an AC electrical signal for application to the impedance component and sensor winding; an analogue-to-digital converter for receiving an electrical signal and for generating a digital voltage signal; a switch having a first end connected to switch alternately between the first end of the impedance component and the second end of the impedance component, and the switch having a second end connected to the analogue-to-digital converter; and a processor connected to the analogue-to-digital converter for receiving a digital voltage signal and for generating a sensor signal, the method may comprise: controlling the switch to connect to the first and second ends of the impedance component sequentially; and detecting delamination of the laminated structure dependent on the sensor signal. The impedance component may comprise a resistor or an inductor.

This alternative method may comprise: generating an AC electrical signal comprising sequential signal blocks for application to the series connected impedance component and sensor winding; and controlling the switch to connect to the analogue-to-digital converter to measure each of the voltages generated at the first and second ends of the impedance component during the same part of the signal block of sequential signal blocks of the signal. This method may comprise storing a signal pattern for at least a part of the signal block; and generating a digital signal by repeatedly using the stored signal pattern. The signal generator and the processor may operate synchronously.

This alternative method may comprise a plurality of Analogue to Digital Converters, each for receiving an electrical signal and for generating a digital voltage signal, the method comprising: controlling the switch to switch to each of the plurality of Analogue to Digital Converters sequentially to measure the voltages to allow simultaneous measurements of the voltages; and processing the sequentially measured voltages for each of the Analogue to Digital Converters. The outputs of the plurality of Analogue to Digital Converters are input into a common multiplexer connected to the processor.

The delamination sensor may generate an output as a measure of impedance or at least one component of the impedance of the sensor winding. Delamination of the laminated structure may be detected dependent on the measure of impedance or at least one component of the impedance of the sensor winding is above or below a threshold.

In a further alternative method, the delamination sensor may comprise: a sensor winding coupled to the transformer core, the sensor winding having a first end and a second end, the sensor winding for sensing a change in the magnetic flux density in the transformer core; an AC voltage source connected to the first end of the sensor winding for generating a square wave AC electrical signal for application to the sensor winding; an AC voltage sensor coupled to the first or second end of the sensor winding for detecting an AC voltage on the sensor winding; an AC current sensor coupled to the first or second end of the sensor winding for detecting an AC current in the sensor winding, and wherein the method comprises: applying a square wave AC electrical signal to the sensor winding; and detecting an AC voltage on the sensor winding using the AC voltage sensor and/or detecting an AC current in the sensor winding using the AC current sensor.

In this further alternative method, delamination of the laminated structure may be detected when the delamination sensor detects a change in the AC voltage and/or AC current. The detected AC voltage on the sensor winding may be low-pass filtered, and wherein delamination of the laminated structure may be detected when the delamination sensor detects a change in a low-pass filtered AC voltage that is greater than a threshold change.

In this further alternative method, the AC voltage source may be a bipolar excitation source whose polarity is reversed when the AC current in the sensor winding reaches a threshold value, and wherein delamination of the laminated structure may be detected when the delamination sensor detects a change in the frequency of the AC voltage on the sensor winding that is greater than a threshold change.

In any of the above methods, the transformer core may be a transformer core having a relative permeability that is greater than 1000, and/or wherein the transformer core is a toroidal transformer core. For two or more heaters, each of the two or more heaters may comprise a return wire, and each of the return wires pass through the transformer core.

LIST OF FIGURES

Embodiments of the present invention will now be described with reference to the accompanying drawings, in which.

DETAILED DESCRIPTION OF THE PREFERRED EMBODIMENTS

In brief, the present invention provides a way of detecting delamination of a laminated structure that is heated by DC powered heaters by passing the source and return wires that supply current to the heaters through a toroidal transformer core. Should there be a breakdown in the laminations, current flowing through the heater will flow into the structure, resulting in less current being present in the return wire than in the source wire. The current imbalance between the source and return wires causes the transformer core to saturate. Using the core saturation, caused by the DC current imbalance, the delamination (or imminent delamination) of the laminated structure can be detected.

We will discuss the detection of the delamination in the context of aircraft systems, although it would be apparent to those skilled in the art that other structures may also benefit from such apparatus and methods. For example the invention may also be used with static structures comprising laminated surfaces that require heating of the surface, road vehicles comprising composite structures and the like.

With regards to the aircraft structures, ice protection systems protect against the build-up of ice on structures such as wings, fuselage, nose-cones, propellers (where present) and the like. During flight, the surfaces of an aircraft can be exposed to water at low temperatures and, if no preventative action is taken, ice can quickly form on the wings, on control surfaces, and on other parts of the aircraft in such a way as to alter the aerodynamic performance of the aircraft (for example by altering the airflow around the aircraft and by adding additional weight to it) with potentially catastrophic consequences. Example ice protection systems are discussed in the following patents and applications in the name of Ultra Electronics Limited (the content of which are hereby incorporated in their entirety by reference): U.S. Pat. No. 7,580,777, WO2008/145985, US20090149997, US20090230239 and U.S. Ser. No. 12/666,776.

Electrothermal ice protection systems comprise a number of heater devices (such as heater mats), which can be used as anti-icing zones in which a sufficient temperature is maintained at the surface of the wing in order to prevent the formation of ice on and behind the protected zone. These heater devices can also be used as de-icing zones to shed ice that has been allowed to accrete on the protected region. The de-icing mats are cyclically energised in order to melt the interface between the wing and the accreted ice, causing the ice to be shed.

In such an ice protection system it is important to avoid overheating of the heater devices (heating mats) in order to avoid a failure either of the devices or in the structure to which the devices are attached. Many modern aircraft (and other structures) use composite materials, which can suffer damage (delamination of the material, for example) at a relatively low temperature. Temperature 'overshoot' of the heater devices must therefore be controlled whilst maintaining rapid heating of the protected surface(s).

Aircraft are normally subject to a range of different icing conditions during flight, such as different air temperatures, air velocities, relative humidity, and so on, which can depend for example on the location, altitude, orientation, air speed or pitch of the aircraft, the prevailing meteorological conditions, and so on. Different icing conditions can determine not only the temperatures and velocities (and so on) at which ice will form on different parts of the aircraft structure, but also the heat loss from the aircraft structure.

Figure 1:
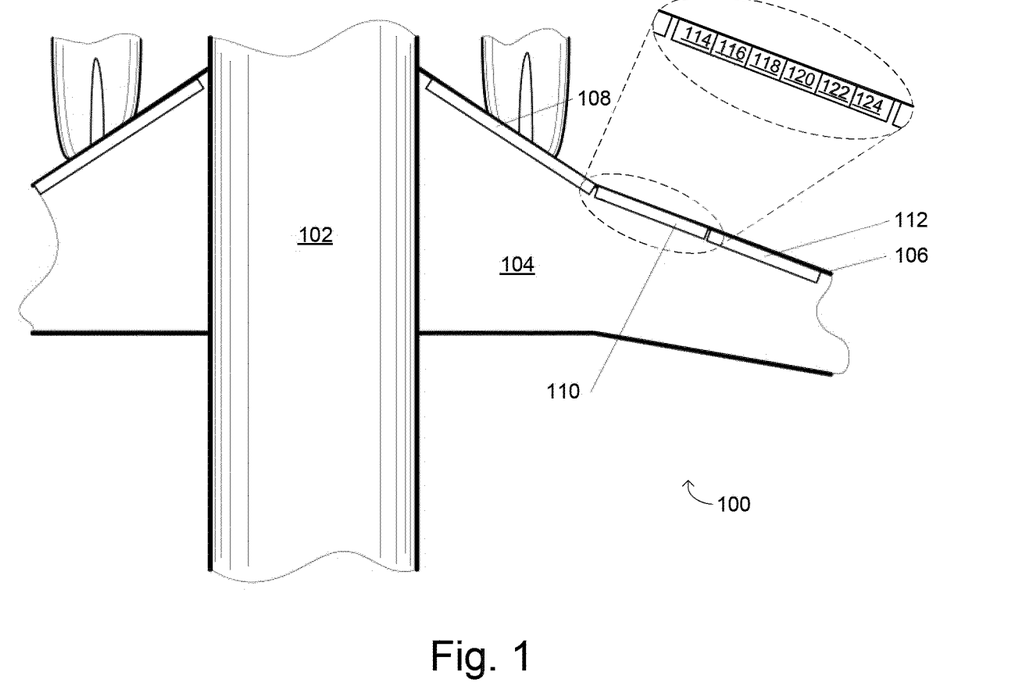
FIG. 1 is an illustration of the placement of heater mats and heater zones of an ice protection system of an aircraft.

FIG. 1 is an illustration of a portion of an aircraft, showing an example placement of heater mats and heater zones of an ice protection system of an aircraft. The aircraft 100 includes a fuselage portion 102 and a wing portion 104. On the leading edge 106 of the wing 104 are provided a plurality of heating mats 108, 110, 112 and others (not shown).

Each heater mat may be divided into a number of heater zones. The number and size of the heater zones are chosen to suit a particular safety model, for example such that up to two heater zones can fail without causing a hazardous or catastrophic failure of the aircraft. In one aircraft design, safety requirements require each heater mat 110 to be divided into six separate heater zones 114, 116, 118, 120, 122, 124.

Figure 2:
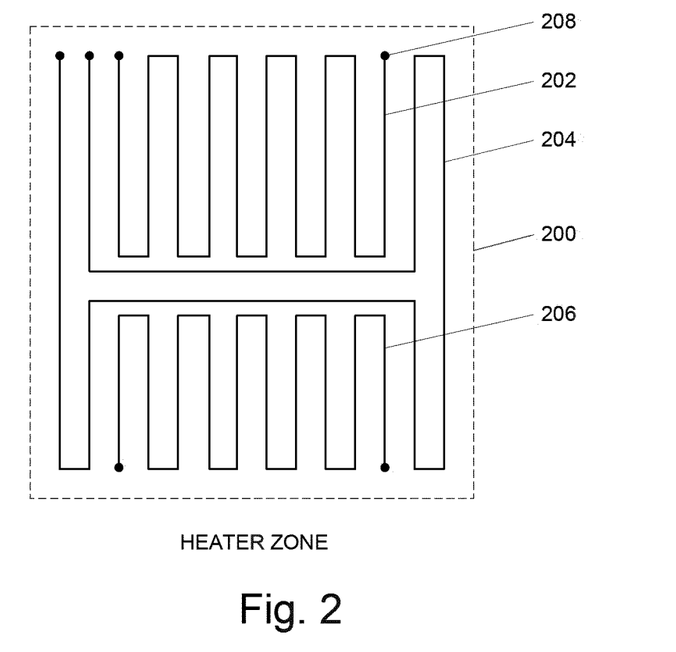
FIG. 2 is a schematic showing the placement of heater elements within a heater zone.

FIG. 2 shows the structure of a heater zone. The heater zone 200 comprises an upper de-icing element 202, a central anti-icing element 204, and a lower de-icing element 206. The elements take the form of resistance heater material arranged in a serpentine configuration and embedded within the heater mat. The elements are provided with contacts 208 to allow power to be applied to the element.

In accordance with known de-icing techniques, the de-icing system, in a de-icing mode, maintains the anti-icing element 204 at a temperature sufficient to prevent ice forming above the element, and intermittently cycles power to the de-icing elements 202, 206 to shed any ice formed above them by run-back water from the anti-icing zone, for example.

Figure 3:
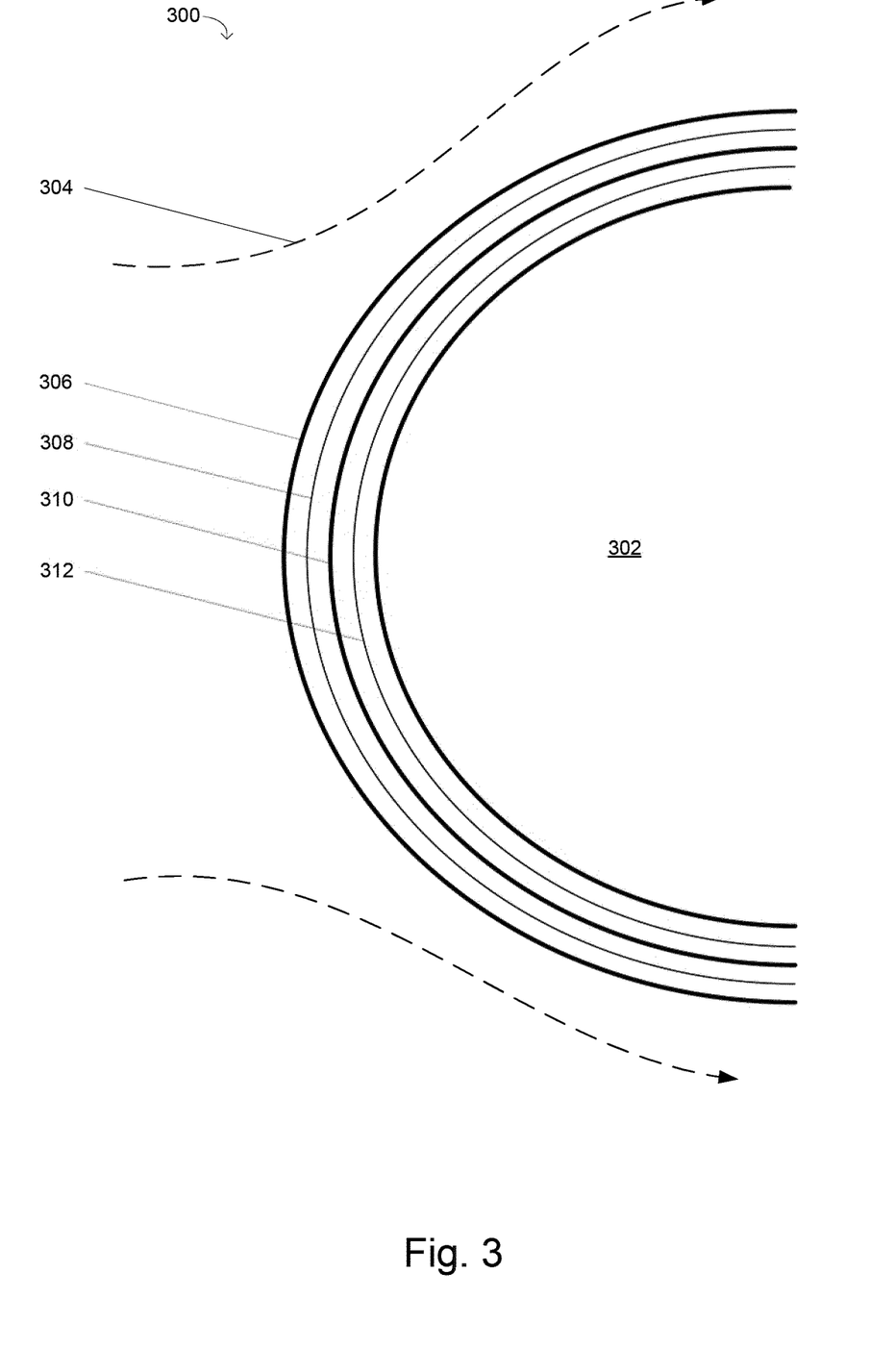
FIG. 3 is a cross-section of the structure of an aircraft wing section.

FIG. 3 is a simplified cross-section 300 of the structure of an aircraft wing section. The figure shows the leading edge 302 of the wing in cross-section and an approximation of the airflow 304 over the wing whilst in flight. The wing includes an outer metallic layer that acts as an erosion shield 306, typically a stiff, erosion-resistant aluminium shield, a dielectric (insulator) 308, a electrothermal heater layer 310, and another dielectric 312. The layers 306, 308, 310, 312 are much thinner than as shown, forming a thin sandwich at the edge of the wing section. The erosion shield 306 may be electrically connected to a wire mesh that is held at a ground potential. In some prior art structures, a temperature probe is used to measure the temperature within the structure, or of the heater. Additionally, a temperature of the other layers can be inferred if the thermal capacity of the different layers is known and/or characterised for that structure. However, temperature probes only monitor the temperature within a certain distance of the probe, therefore temperature probes are not appropriate means of detecting delamination, or potential delamination, in a structure, as a delamination may occur in a region not monitored by a temperature probe.

Figure 4A:
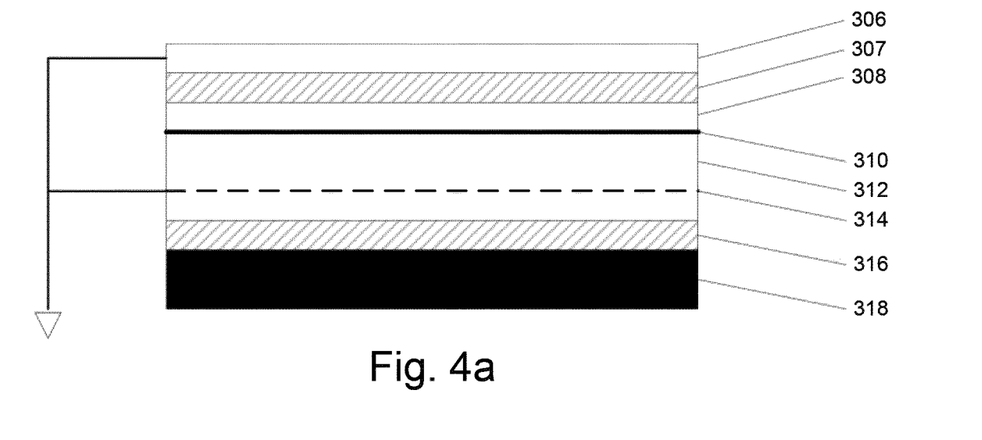
FIGS. 4a, 4b and 4c show different cross-sections of a wing structure.
Figure 4B:
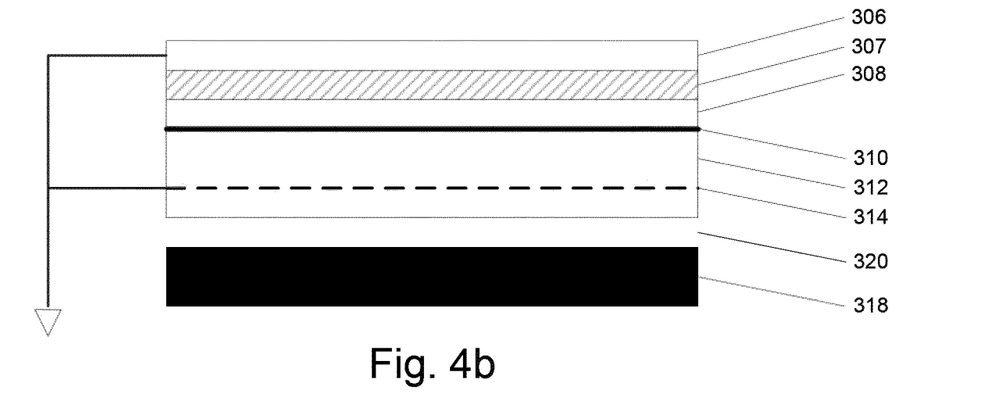
Figure 4C:
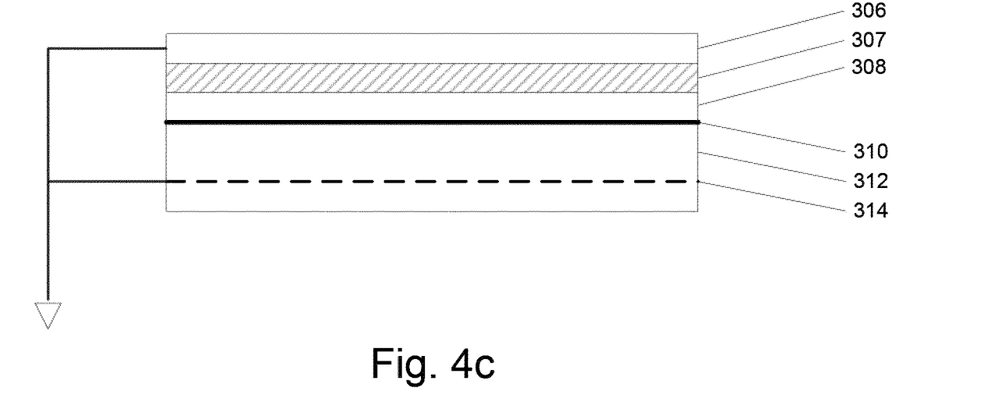

FIGS. 4a, 4b and 4c show more detailed cross-sections of different example structures 300.

FIG. 4a shows a structure 300 comprising an outer metallic layer that acts as an erosion shield 306, typically a stiff, erosion-resistant aluminium shield, a layer of adhesive 307, which bonds the erosion shield to a dielectric (insulator) 308 layer. An electrothermal heater layer 310 is found between dielectric layers 308 and 312. A conductive layer (ground plane) is located within the dielectric and a layer of adhesive 316 is used to attach the above layers to a structure 318. As can be seen, the erosion shield 306 is connected to the electrically conducting layer 314 (that may, for example, take the form of a wire mesh), both of which are held at a ground potential.

FIG. 4b shows an alternative, where the arrangement is similar to that of FIG. 4a, only that an air gap 320 is provided between the structure 318 and the dielectric layer 314. The air gap provides a layer of thermal insulation so that the structure adjacent to the rear of the heater mat does not run at the heater mat temperature. Instead, the structure runs at the average of the air temperatures on either side of the structure. The structure is the mechanical support of the slat. This allows properties of the slat structure to be picked for strength and fatigue resistance rather than temperature resistance FIG. 4c shows the upper layers of the construction, which are similar to that of FIG. 4a.

The main wing section 302 is formed from any appropriate material, such as composite materials that comprise a plurality of layers of stiff material bound together with glue. Composite materials have a good ratio of strength to weight, but are susceptible to failure by delamination (when the glue melts) at a relatively low temperature. Therefore care needs to be taken to avoid 'overshoot' (overheating) of the heater mat.

It will be appreciated that a similar arrangement may be provided on other exposed parts of the aircraft structure (such as on propeller leading edges or on engine inlets, for example). It will also be appreciated that the temperature sensor 314 may be located between the heater mat 310 and the erosion shield 306.

Should a heater 310 overheat or overshoot a maximum operating temperature, the laminated structure may be damaged through this excessive heating. For example, pockets of carbonisation may form in front or behind the heater, which may cause the structure to overheat further (since the thermal path between the heater and outer and/or inner surface is compromised) and begin to delaminate.

The heater may be caused to overheat or overshoot by a number of scenarios, for example poor control of the heater, or manufacturing faults within the laminated structure causing air pockets within the laminations to be formed during manufacturing, or damage to one or more of the layers during striking of the structure by an object, for example a bird strike.

In such situations, the heater 310 itself may be used to detect the delamination, or the start of delamination before it progresses to a catastrophic failure. Such a warning would be useful to a pilot of the aircraft, who could take evasive manoeuvres, for example by shutting down the ice protection system, before further damage results in a catastrophic failure.

Figure 5:
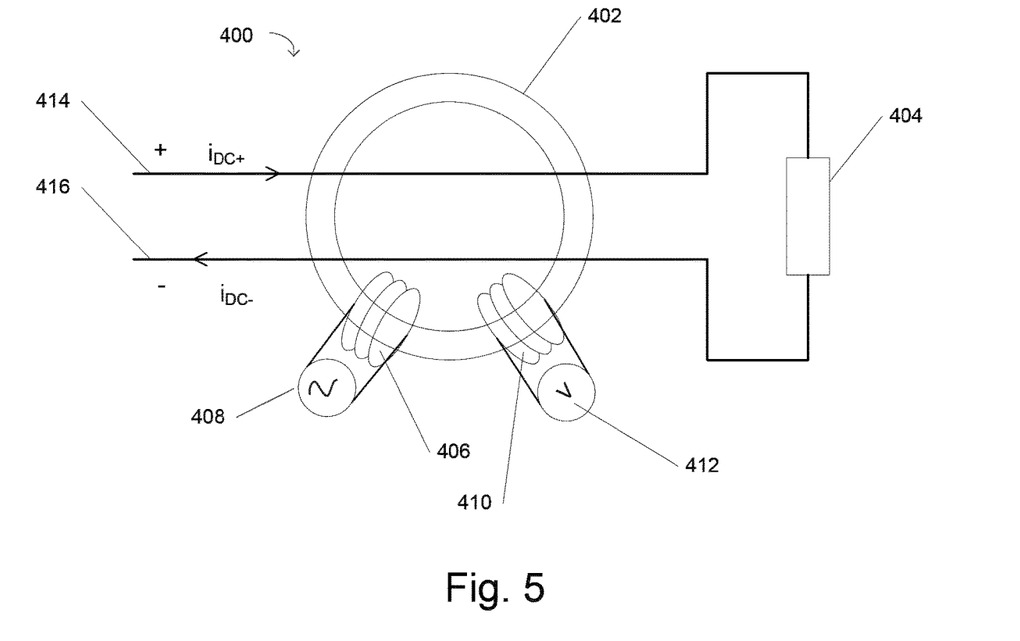
FIG. 5 shows a first arrangement to detect delamination in a structure where one heater is present.

A first example delamination detector is shown in FIG. 5. The system shown comprises a heater 404 that is powered via source 410 wire and return 412 wire. A DC current $i_{DC}$ passes through the wires and through the heater to cause the heater 404 to heat up. Heater 404 is attached to a laminated structure, which is not shown in the drawings for the sake of clarity. The heater is mechanically and thermally coupled to the laminated structure.

The source 414 and return 416 wires, connected to the heater 404, pass through a transformer core 402. Whilst the figures show a transformer core that is toroidal, it need not necessarily be toroidal in form. In its simplest form, the transformer core is preferably a magnetically closed loop that is saturable. The transformer core is preferable a high permeability core, such as 4555 nickel-iron alloy, although any core having a relative permeability greater than 1000 could be used in the embodiments described.

Coupled with the core are two windings: the sensor source winding 406 and the detector winding 410. The sensor source winding 408 is connected to an AC voltage source for generating and supplying an AC sensor voltage to the sensor winding 406. An AC voltage sensor 412 is connected to the detector winding 410 to detect AC voltages. The sensor winding 406 and detector winding 410 are coupled to each other via the transformer core 402 such that AC voltages present on the sensor source winding 406 are also present on the detector winding 410.

When the heater is supplied with current $i_{DC}$, and when there are no structural defects or delaminations in the laminated structure, the current flowing in the source and return wires are substantially the same. In such a case, the transformer remains in an unsaturated state. An AC voltage source 408 supplying an AC voltage to the sensor winding 406 will thus be coupled to the detector winding 410 via the transformer core 402 and be measurable via the voltage sensor 412 connected to the detector winding 410.

However, should there be current leakage in the structure as a result of defects or delaminations, then the current in the source 414 and return 416 wires is not substantially the same, which results in the transformer core 402 being driven into saturation. In a saturated state, the coupling between the sensor 406 and detector 410 windings is affected and a change in the magnitude and/or shape of the AC sensor voltage is detectable.

The delamination detector thus detects delamination and/or failure in the laminated structure through a change in the sensed AC voltage coupled across the transformer core 402.

The change in magnitude and/or shape of the detected AC sensor voltage may be through a direct comparison of the AC voltage source 408 and the detected AC voltage. It may instead be done only through monitoring of the detected AC voltage over and period of time and detecting changes in the received AC voltage over time. Whichever method is chosen, variations greater than a threshold value may cause the delamination detector to detect the delamination(s).

Once a delamination is detected, this may cause the delamination detector to notify a user of the presence of delaminations and/or failure in the laminated structure. In some embodiments, the delamination detector may also be configured to switch off the current to the heater to prevent further damage to the laminated structure.

Figure 6:
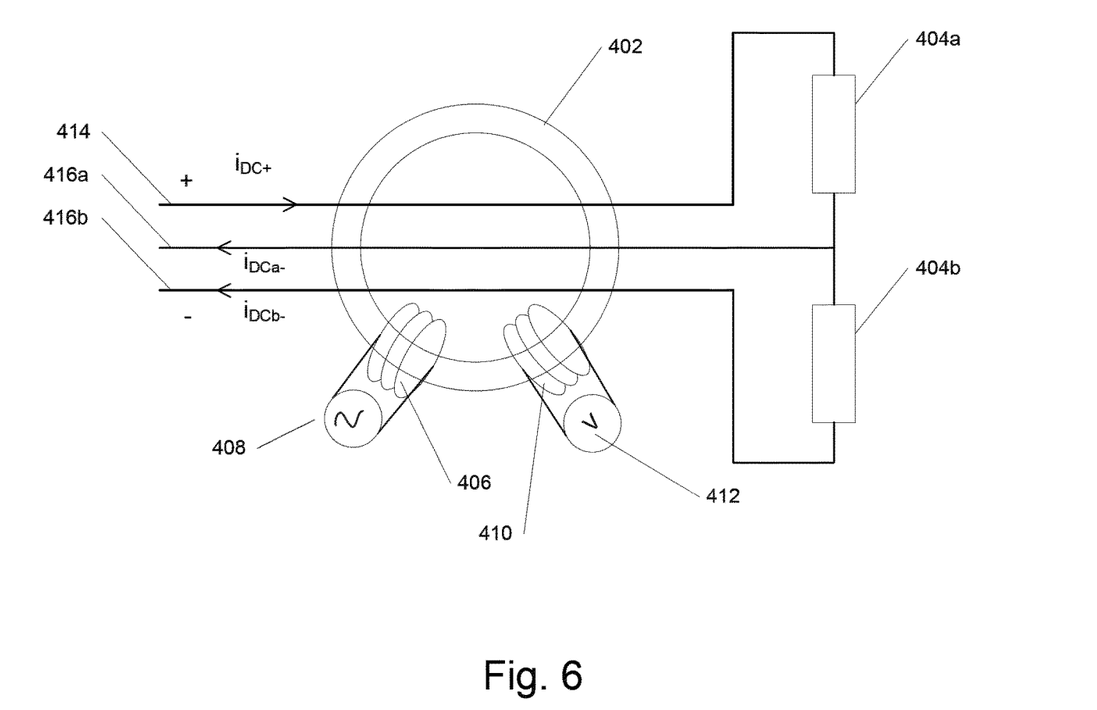
FIG. 6 shows the first arrangement to detect delamination in a structure where multiple heaters are present.

FIG. 6 shows a system similar to FIG. 5, except that in FIG. 6, more heaters 404a and 404b are present. Whilst only two are shown, it would be understood that more heaters may be present that shown.

Apart from that difference, the detectors are substantially the same in FIGS. 3 and 4, and the detectors work in the same manner. The heaters are supplied with a current $i_{DC+}$ on source wire 414 that passes through the transformer core 402, and the return currents $i_{DCa-}$ and $i_{DCb-}$ are also passed through the transformer core 402. During normal operation (where there are no delamination or defects in the laminated structure), the source and combined return currents are substantially the same, so the transformer core 402 operates in an unsaturated state.

However, a delamination or failure in the laminated structure in the region associated with either or both of the heaters 404a, 404b will result in a current imbalance between the source and return currents passing through the transformer core. This results in the transformer core 402 being in a saturated state, which again affects the coupled AC voltage between the sensor winding 406 and the detector winding 410. In terms of the detection of the delamination or failure of the laminated structure, the same principles and detection schemes are used in FIG. 4 as in FIG. 3.

Similarly, the result of detection of any delamination or failure in the laminated structure is also the same as with FIG. 3.

Figure 7:
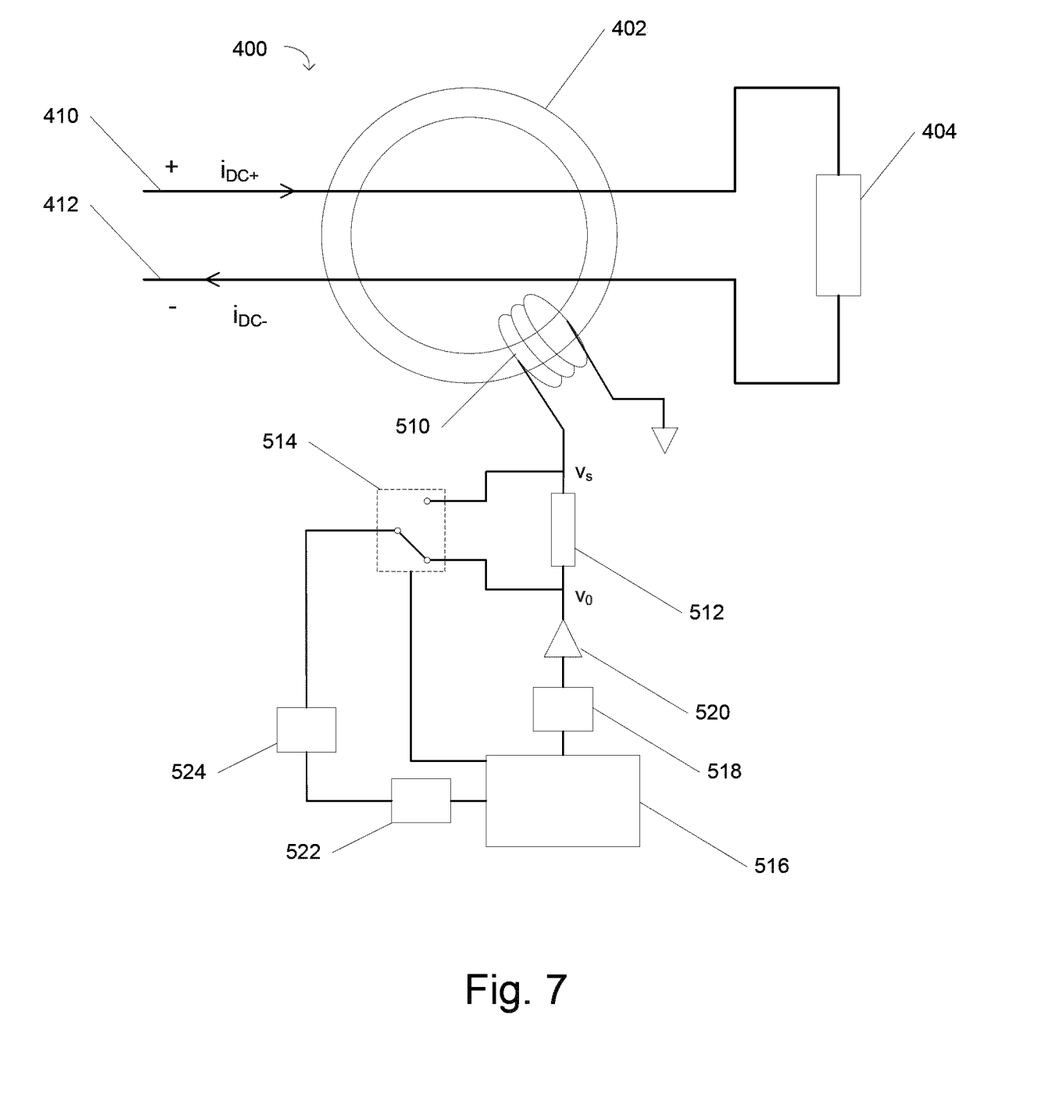
FIG. 7 shows a second arrangement to detect delamination in a structure.

FIG. 7 shows an alternative detector where the principles of operation (in terms of a saturated transformer core resulting from an imbalance between the source and return currents powering the heater) are similar to those of FIGS. 5 and 6. Similarly, the alternative detector may also be used with more than one heater as with FIG. 6. However, FIG. 7 shows only one heater for the sake of clarity.

The detector of FIG. 7 comprises a sensor winding 510, which is grounded at one end, and connected to a detector at the other end. This embodiment utilises an AC signal being pass through the detector winding 510, and either detects variations in the magnitude and/or shape of the AC signal resulting from the changing impedance of the sensor winding 510 resulting from saturation of the transformer core 402, or detects the change in impedance of the sensor winding 510 resulting from saturation of the coil.

A load resistance 512, which is temperature and age stable and whose value is known and stored in memory, is connected in series with the detector winding. One end of the load resistance 512 is connected to an amplifier 520, which generates a drive signal comprising at least one sinusoidal signal. The other end of the load resistance 512 is connected to the sensor winding 510.

A processor 516 is provided with a program memory to control the operation of the processor. An erasable programmable read-only memory (EEPROM) is provided to store data to be used by the processor 516. The data stored in the EEPROM can include waveform generation data comprising a digital representation of at least a part of a waveform. Alternatively this can be stored in the program memory or the random access memory (RAM). The processor 516 is thus able to read the data from the EEPROM in order to generate a continuous digital waveform which in this embodiment comprises a single wave form for simplifying explanation hereinafter. The storage of the waveform within the EEPROM (or other memory location) makes the production of the digital drive waveform simple. A processor 516 is not required to perform calculations in order to determine output values for a cyclical waveform; instead values are simply repeatedly read out of the EEPROM.

The digital drive signal output from the processor 516 is input to a digital-to-analogue converter 518 to generate an analogue wave signal which is passed through a low pass filter (not shown) and input to the amplifier 520 to generate the drive signal to the load resistor 512. The low pass filter acts to 'reconstruct' this signal by reducing undesirable artefacts of the digital-to-analogue conversion process. In an alternative embodiment the DAC 518 can be replaced with a pulse width modulated digital output directly from the processor 516.

The resistance value of the load resistor 512 can be stored in the EEPROM, the program memory or the RAM for use in data processing. In fact to avoid the requirement for a division in the computation, the reciprocal of the resistance value may be stored so that a multiplication operation can be used in the calculation instead.

The processor 516, the DAC 518, the ADC 522, the EEPROM, the RAM and the memory can all be provided on a microcontroller such as the Microchip PIC series. Thus the microcontroller can perform the function of signal generation and signal processing.

In this embodiment of the present invention a single measurement channel is provided comprising an analogue-to-digital converter 522 to provide a digitised input to the processor 516. Preferably the measurement channel further comprises a low pass filter 524. The measurement channel is connected to a switch arrangement 514, which receives as inputs connections from either side of the load resistor 512. The switch arrangement is controlled by a control signal from the processor 516 to switch between measurements of the voltages $v_o$ and $v_s$ either side of the load resistor 512.

The processor 516 controls the generation of the sinusoidal output signal to be in synchronism with the measurements input from the analogue-to-digital converter. Thus the waveforms are generated and measured synchronously. The processor 516 can comprise a microcontroller to control the output as well as the acquisition of the input samples. The output sequence comprises a block of samples during which the switch 514 is controlled so that the measurement channel measures the voltage on one side of the load resistor 512 i.e.

during one measurement period. The block of samples may contain any multiple of cycles of a periodic waveform, such as a single sinusoid. The processor 516 then controls the switch 514 to switch to receive measurements of the voltage on the other side of the load resistor 512 and during this measurement period the processor 516 outputs a sequence identical to the previous sequence. Thus during pairs of measurement periods the output sequences are identical. It is thus preferable for the successive measurements to occur over successive blocks. The blocks need not be consecutive. It is possible for there to be a quiescent period between measurements, or the blocks can be filled with an initial number of zeros. However, to avoid latency it is preferred that measurements are taken successively and each measurement period comprises a whole block of data. In order to compensate for any transient factors, it is possible for the first part of the responses to the output to be discarded or not measured to allow for settlement. It is preferred that the measurements be taken during the same section of successive blocks to avoid for the need for any phase compensation. However, the present invention encompasses the possibility of compensating for different phase measurements. The blocks themselves may be different from one pair of measurements to the next.

As can be seen in this embodiment, since there is only one measurement channel comprising the low pass filter 524 and the analogue-to-digital converter 522, there is no requirement for accurate gain and phase matching of two filters and analogue-to-digital converters. Since all measurements are carried out using a single measurement channel, all measurements are equally affected by the characteristics of the measurement channel and thus in the calculations these factors cancel out.

Thus measurements are provided to the processor in successive blocks of the voltage $v_s$ on one side of the load resistor 512 which comprises the voltage applied across the sensor winding 510. The other voltage measurement obtained is the voltage $v_o$ on the drive side of the load resistor 512.

The load resistance 512 is provided to enable the determination of the current flowing through the sensor winding 510. The complex amplitude of the current can be calculated using Ohm's law as follows:

$$I = \frac{V_o - V_s}{R}$$

where $V_o$ and $V_s$ are the complex amplitudes at some frequency of $v_o$ and $v_s$.

The impedance of the sensor core 510 at this frequency is given by:

$$Z = V_s / I$$

Therefore:

$$Z = \frac{V_s R}{V_o - V_s}$$

It can be seen from this equation that impedance can be calculated from the ratio of the two complex voltage amplitudes taking into consideration the load resistance. In other words the value of the impedance is dependent upon the ratio of the voltage across the device and the voltage difference across the load resistance 21.

In one embodiment of the present invention the sequential measurements can be used to calculate the impedance of the sensor winding 510. To detect a change of impedance, the impedance value can be compared with a threshold impedance value to determine whether or not there is a failure in the laminated structure.

Such embodiments to the present invention, which involve the calculation of the impedance, however, require for a computationally expensive division operation to be carried out. Such divisions, also can result in out of range results e.g. a divide by zero operation which can be caused by noise.

A preferred embodiment of the present invention does not result in the calculation of an absolute value for impedance. Instead quantities derived from the $V_s$ and the $V_o - V_s$ are compared to identify a change in the relative values. This can be used to compare the relative values with a threshold.

The explanation of the operation of the measurement and processing is complicated by the fact that the drive signal generation and processing is performed digitally and the measurements comprise complex values for the voltage including phase and amplitude information. Also, impedance is complex:

$$Z = R + j\omega L$$

In this simplified embodiment, the output drive signal comprises a sinusoidal signal at a predetermined angular frequency $\omega$. Samples of this signal will be clocked out of the digital-to-analogue converter at a sample frequency $f_s = 1/\tau$, where $\tau$ is the sample period. Each block of the samples can be denoted by:

$$v_{on} = \text{real}(V_o z^n) \text{ for } n = -P \text{ to } M-1$$

where $z = e^{j\omega\xi}$, $V_o$ is the complex amplitude of the output voltage, P is a positive integer or zero indicating the number of samples of the block which may be zeroed to allow for settling, and M is a positive integer.

Normally there is no point in choosing $V_o$ to be anything other than 1 since the units of the signal are arbitrary and there is no point in requiring a complex multiplication to be performed as each output sample is generated. Typically therefore only the real part of $z^n$ is needed to generate the output. These values are calculated and stored in the EEPROM memory or program memory beforehand, or they can be precomputed and stored in the RAM.

There may be occasions when the phase of the output drive signal is desired to be varied from one pair of blocks to another pair of blocks to help decorrelate it from an otherwise phase-locked interfering signal (such as cross-talk from another sensing system running at precisely the same frequency). In this case, both the real and imaginary components of $z^n$ will preferably be pre-calculated and stored so that an output of arbitrary initial phase can be generated.

Due to periodicities and symmetries in the output sequence, it is possible to store fewer than P+M values of $z^n$ and still be able to generate the entire output sequence without any additional arithmetic operations. The storage of such a partial representation of the generated waveform reduces the memory requirement.

As the output sequence is generated by the processor 516, one of the continuous-time input signals v(t) is synchronously sampled to yield a sequence of input samples, $v_n$ for n=0 to M−1, (where the first P samples of the block have been discarded or not measured to allow for settling). Each sample is then multiplied by $z^{-n}$ i.e $e^{-j\omega t}$ (a phase inverse of the complex generated signal of which the generated sinusoidal signal is a part). The digitised values $z^{-n}$ for $e^{-j\omega t}$ are stored in the EEPROM (or program memory or RAM) to avoid the need to calculate them in real time. The result is the weighted sequence which is summed over the M terms to yield an estimate of the complex amplitude V of the signal at angular frequency ω. This can be represented as:

$$v(t) = \text{real}(V(\omega)e^{j\omega t}) + \sigma(t)$$

where σ denotes any components in the signal that are not desired (e.g. noise), then $$v_n = \text{real}(V(\omega)z^n) + \sigma_n$$

and $$\sum_0^{M-1} v_n z^{-n} = \frac{MV}{2} + \frac{1}{2}\sum_0^{M-1} V^* z^{-2n} + \sum_0^{M-1} \sigma_n z^{-n}.$$

The second term on the right hand side is oscillatory with M, and therefore loses significance relative to the first term if M is large. The third term on the right hand side can also be neglected for large enough M provided the "noise" is uncorrelated with the output drive signal. It is particularly advantageous if $f_s$ be chosen such that $$f_s = \frac{N\omega}{2\pi}$$

where N is a positive integer, and M is chosen such that M=pN, where p is also a positive integer. In this special case, the second term on the right hand side above is zero. In any case, the estimate of V, denoted $\hat{V}$, is given by $$\frac{M\hat{V}}{2} = \sum_0^{M-1} v_n z^{-n}$$

This requires just two multiplications and additions at each sample point, and is therefore extremely economical on processing power. A basic microcontroller can manage this with less than 10% of its processing ability at useful sample rates.

In systems with more than one sinusoid component in the output drive signal, it is particularly advantageous if the frequencies of those components each obey the relation:

$$\omega_p = 2\pi f_s \frac{p}{M}$$

$$0 \leq p \leq \frac{M}{2}$$

where p is a positive integer, and $\omega_p$ is the angular frequency of the $p^{th}$ component.

In this case, whole cycles of each of the components fit within the M samples that are used in the calculation of the estimates of the complex voltage amplitudes. These estimates are calculated in a way analogous to that used for a single frequency system, viz.

$$\frac{M\hat{V}_p}{2} = \sum_0^{M-1} v_n z_p^{-n}$$

where $\hat{V}_p$ is the complex amplitude of the voltage component at angular frequency $\omega_p$ and $z_p = e^{j\omega_p \tau}$. If there is a special relationship among the excitation frequencies of a multi-frequency system, it is often possible to avoid storing a complete set of the weights $z_p^{n}$ for each frequency component because many of the weights will be common to more than one component. For example if p=1, 2 in a two-frequency system, at most only the weights $z_1^n$ (n=0 to M−1) need be stored, as the weights $z_2^n$ are already contained within, and can be picked out of the $z_1^n$.

A window function can be applied to a sample block in order to reduce windowing effects. The window function can easily be incorporated by modifying the weights $z^{-n}$ with the window weight (say $w_n$) and pre-storing the result $w_n z^{-n}$ in the EEPROM. Such window functions are well known in the art. This can mean that some additional storage is required for the modified weights, but no additional arithmetic operations are needed to form the estimate of V. Alternatively the values stored for the signal samples can be a combination of $z^{-n}$ and the window weights to avoid the need for additional storage and pre-calculation at run time. The window function can also overcome start-up transients by including leading zeros.

Another method of estimating V would be to low-pass filter the weighted input sequence. This is really just another form of averaging, and could be performed by e.g. convolving the weighted sequence with the impulse response of the chosen filter. Alternatively, the unweighted input sequence could be convolved with the impulse response of a band-pass filter with its pass-band centred substantially at an angular frequency of ω. These alternatives will require more computation and storage, however. Both of these alternatives could also be implemented "in the frequency-domain", in which case a Fast Fourier Transform (FFT) of the weighted or unweighted input sequence is typically taken prior to modifying it by the transfer function of the chosen filter. (In these cases, M will normally be chosen to be a power of 2). These alternatives also require more computation. These alternatives are also applicable to signals containing more than one frequency component.

The above process, applied to the two consecutively measured input signals (or "block-pair"), will yield $$\frac{M\hat{V}_S}{2} \equiv \hat{A}_S,$$

say, and $$\frac{M\hat{V}_o}{2} \equiv \hat{A}_o$$

where $\hat{V}_S$ and $\hat{V}_o$ are the complex voltage amplitude estimates measured by the system at the sensor winding 510 and at the output of the amplifier 520 respectively (i.e. at either end of the load resistor 512). The difference value is then calculated using $\hat{A}_R = \hat{A}_o - \hat{A}_S$. Cross- and auto-power spectral estimators are then formed as $$\hat{S}_{RS} = \hat{A}_S \hat{A}^*_R$$

and $$\hat{S}_{RR} = \hat{A}_R \hat{A}^*_R.$$

where $\hat{A}^*_R$ is the complex conjugate of $\hat{A}_R$.

These quantities can be further averaged (e.g. over several block-pairs) if their variances are desired to be reduced.

It should be noted that the multiplication of the complex first and second parameters $\hat{A}_R$ and $\hat{A}_S$ by $\hat{A}^*_R$ causes the product $\hat{A}_R \hat{A}^*_R$ to be generated, which is real. This facilitates the comparison of the third and fourth parameters $\hat{S}_{RS}$ and $\hat{S}_{RR}$, and avoids the need to perform computationally complex division of the parameters since it facilitates a threshold comparison. Also, this facilitates the averaging of measurements or parameters.

The thresholding of the results, in order to identify a threshold change in impedance can be summarized as the determination of any one of the following:

real$(\hat{S}_{RS})$>H$\hat{S}_{RR?}$ (threshold on the linear resistive part of the impedance)

imag$(\hat{S}_{RS})$>H$\hat{S}_{RR?}$ (threshold on the linear reactive part of the impedance)

or abs$(\hat{S}_{RS})$>H$\hat{S}_{RR?}$ (threshold on the magnitude of the linear part of the impedance) (or, equivalently, $\hat{S}_{RS}\hat{S}^*_{RS}$>H$\hat{S}_{RR?}^{"}$), or more generally, real$(\hat{S}_{RS}e^{j\phi})$)×H$\hat{S}_{RR?}$ Etc. where $\phi$ is a quantity selected by the designer or derived as part of the processing or even more generally, $G_r$(real$(\hat{S}_{RS}e^{j\phi})$)+$G_i$(imag$(\hat{S}_{RS}e^{j\phi})$)>H$\hat{S}_{RR?}$ where $G_r$ and $G_i$ are arbitrary real functions selected by the designer or derived by the processing.

The above formulae can also be generalised to use an impedance measure derived from 2 different frequency measurements. This would take the form given below in one example $$\text{imag}(\alpha \hat{S}_{RS}(\omega_1)\hat{S}_{RR}(\omega_2)+\beta \hat{S}_{RS}(\omega_2)\hat{S}_{RR}(\omega_1))>H\hat{S}_{RR}(\omega_1)\hat{S}_{RR}(\omega_2)_?$$

(this is a threshold on the linear reactive part of the weighted impedance measure), where $\omega_1$ and $\omega_2$ indicate measurements at 2 frequencies and $\alpha$ and $\beta$ are constants determining the weight applied to the measurements at frequency 1 and 2. This type of weighted sum comparison can obviously be generalized to the other types of thresholding listed above. The values $\alpha$, $\beta=\pm 1$ are particularly useful for forming measures of sums or differences of components of impedance at different frequencies for comparison with a threshold. This type of weighted sum can also be generalized to more than 2 frequencies without difficulty.

In the above embodiments the "$H_1$" transfer function is used. However as an alternative the "$H_2$" transfer function could be used and will give rise to the inequalities:

$\hat{S}_{SS}$real$(\hat{S}^*_{SR})$>H$\hat{S}^*_{SR}\hat{S}_{SR?}$ (threshold on the linear resistive part of the impedance)

$\hat{S}_{SS}$imag$(\hat{S}^*_{SR})$>H$\hat{S}^*_{SR}\hat{S}_{SR?}$ (threshold on the linear reactive (inductive) part of the impedance)

$\hat{S}^*_{SS}\hat{S}_{SS}$>H$\hat{S}^*_{SR}\hat{S}_{SR?}$ on the magnitude of the linear part of the impedance)

or more generally, $\hat{S}_{SS}$real$(\hat{S}^*_{SR}e^{j\phi})$>H$\hat{S}_{SR?}$ Etc. where $\phi$ is some constant chosen by the designer or derived by the process where $\hat{S}_{SS}=\hat{A}_S\hat{A}^*_S$ and $\hat{S}_{SR}=\hat{S}^*_{RS}$.

In setting the above thresholds, H will contain numerical constants relating to the system and the processing that can be pre-calculated and will not vary from one set of electronics to another. It will also contain the precise value (or its reciprocal) of the load resistance, which is stored in the EEPROM 25 (or other memory) following a calibration process or end-of-line test.

It is clear from the above that in order to identify whether a change in impedance (or at least one component of it) is above or below a threshold its actual value need not be computed and compared to a threshold. Instead, the relative values of two parameters related to the current and the voltage in the device can be compared to determine if their relationship is above or below a threshold.

In one embodiment hysteresis is added into the comparison in order to avoid 'hunting' when the impedance (or at least one component of it) fluctuates close to the threshold. Accordingly the threshold can be dependent upon the current state i.e. whether the quantity related to the current impedance (or at least one component of it) is above or below the threshold. In order for the system to generate an output the inequality is adjusted either by adjusting H or by adding a factor into either side of the inequality. Thus if the quantity related to the impedance component was above the threshold for a previous measurement, for example real$(\hat{S}_{RS})$ >H$\hat{S}_{RR}$, the effective threshold is made smaller either by reducing H or by adding a factor to the left hand side of the inequality (or subtracting a factor from the right hand side of the inequality). Similarly if the quantity related to the impedance was below the threshold for a previous measurement, for example real$(\hat{S}_{RS})$≤H$\hat{S}_{RR}$, the effective threshold is made bigger either by increasing H or by adding a factor to the right hand side of the inequality (or subtracting a factor from the left hand side of the inequality).

Similar to the embodiments shown in FIGS. 5 and 6, once a determination of the change in impedance is greater than a threshold (indicating that the transformer core has reached saturation due to an imbalance of the source and return currents caused by the failure or delamination of the laminated structure), the delamination detector may be configured to alert a user of the failure and/or configured to switch off the current to the heater to prevent further damage to the laminated structure.

Figure 8:
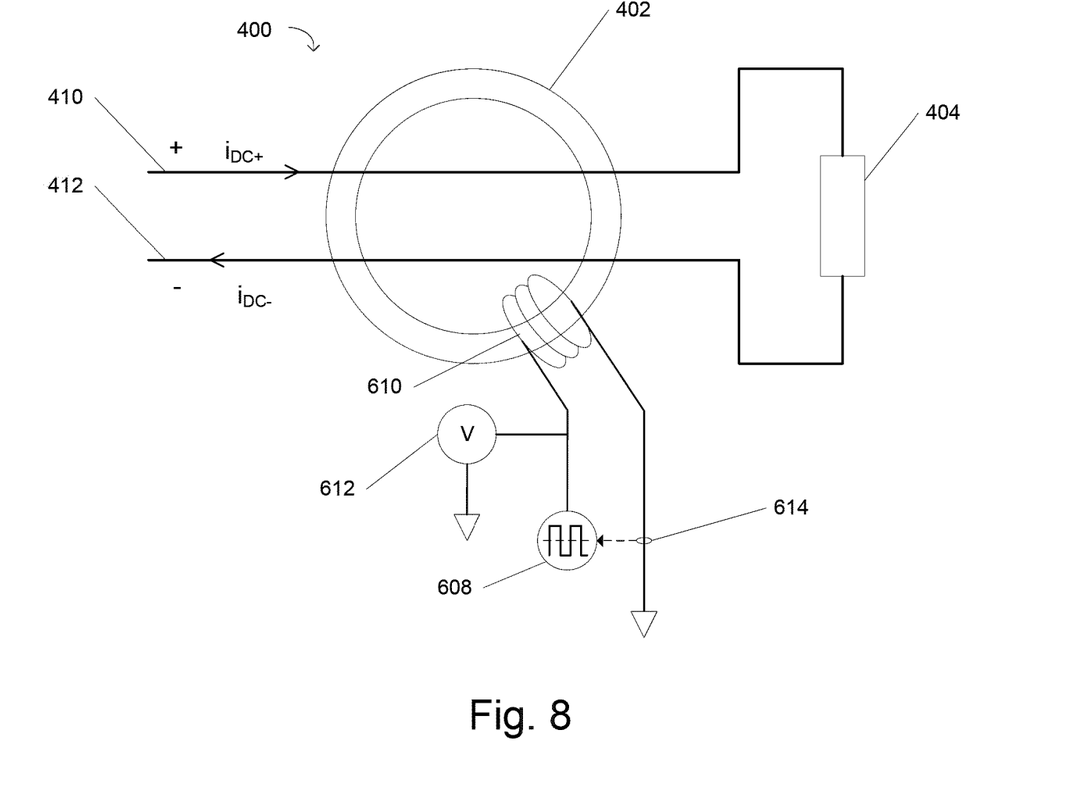
FIG. 8 shows a third arrangement to detect delamination in a structure.

A further embodiment of detecting delamination is shown in FIG. 8. The detector of FIG. 8 comprises a sensor winding 610, which is coupled to a voltage sensor 612. The voltage source 608 is attached to the input of the sensor winding 610. The principle used for this embodiment relies on the variation in impedance of the sensor winding 610 caused by the imbalance of the DC currents due to current leakage as with the above embodiments. When the transformer core is saturated, the impedance differs to that when the transformer core to is not saturated.

The voltage source 608 is a bipolar excitation whose polarity is reversed when the magnitude of the current in the winding reaches a predetermined threshold. Therefore, the frequency of the excitation depends on such design parameters as the current monitor threshold and transformer core/winding as well as the level of magnetic flux density in the transformer core due to DC leakage current. The low pass filtered voltage (measured using the voltage sensor 612) and the frequency of the excitation signal gives an indication of the impedance of the winding. The current in the winding is sensed using a current sensor 614. As such, this configuration gives an indication of the impedance of the winding, which in turn enables the detection of the transformer core 402 being in a saturated or unsaturated state. As with the above embodiments, if the transformer core 402 is in a saturated state, there is a DC current imbalance in the DC wires, which is indicative of delamination in the structure (resulting in current leakage within the heating circuit). If the transformer is in an unsaturated state, there is no leakage and no delamination.

Similar to the above embodiments, once a determination of the change in impedance is greater than a threshold (indicating that the transformer core has reached saturation due to an imbalance of the source and return currents caused by the failure or delamination of the laminated structure), the delamination detector may be configured to alert a user of the failure and/or configured to switch off the current to the heater to prevent further damage to the laminated structure.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. An apparatus for detecting delamination in a laminated structure, the laminated structure comprising a plurality of laminated layers, the apparatus comprising:
   one or more heaters mechanically and thermally connected to the laminated structure for heating the laminated structure, the one or more heaters being disposed between first and second ground layers within the laminated structure;
   a controller electrically coupled to the one or more heaters via source and return wires, the controller being configured to supply the one or more heaters with a DC current through the source and return wires to heat the one or more heaters;
   a magnetically saturable closed loop transformer core, the source and return wires carrying the DC current passing through the transformer core; and
   a delamination sensor coupled to the transformer core for detecting a DC current imbalance in the source and return wires,
   wherein the delamination sensor detects delamination in the laminated structure upon detection of a DC current imbalance in the source and return wires.

2. An apparatus according to claim 1, wherein the delamination sensor comprises:
   a sensor source winding coupled to the transformer core and receiving an AC sensor voltage;
   a detector winding coupled to the transformer core; and
   an AC voltage sensor coupled to the detector winding for detecting an AC voltage on the detector winding through transformer coupling with the sensor source winding.

3. An apparatus according to claim 2, wherein delamination of the laminated structure is detected when the sensor detects a change in the AC voltage.

4. An apparatus according to claim 3, wherein delamination of the laminated structure is detected when the sensor detects a decrease in the magnitude of the AC voltage detected on the detector winding, and/or when the sensor detects a change in the shape of the AC voltage on the detector winding.

5. An apparatus according to claim 3, wherein the AC voltage input to the sensor source winding is compared with the AC voltage detected on the detector winding.

6. An apparatus according to claim 1, wherein the delamination sensor comprises:
   a sensor winding coupled to the transformer core, the sensor winding having a first end and a second end, the second end being connected to ground, the sensor winding for sensing a change in the magnetic flux density in the transformer core;
   an impedance component having a known impedance and having a first end and a second end, the first end being connected to the first end of the sensor winding;
   a signal generator connected to the second end of the impedance component for generating an AC electrical signal for application to the impedance component and sensor winding;
   an analogue-to-digital converter for receiving an electrical signal and for generating a digital voltage signal;
   a switch having a first end connected to switch alternately between the first end of the impedance component and the second end of the impedance component, and the switch having a second end connected to the analogue-to-digital converter; and
   a processor connected to the analogue-to-digital converter for receiving a digital voltage signal and for generating a sensor signal, wherein the processor is adapted to control the switch to connect to the first and second ends of the impedance component sequentially,
   wherein delamination of the laminated structure is detected dependent on the sensor signal.

7. An apparatus according to claim 6, wherein the impedance component comprises a resistor or an inductor.

8. An apparatus according to claim 6, wherein the signal generator is adapted to generate the AC electrical signal comprising sequential signal blocks for application to the series connected impedance component and sensor winding, and wherein the switch is adapted to switch to connect the analogue-to-digital converter to measure each of the voltages generated at the first and second ends of the impedance component during the same part of the signal block of sequential signal blocks of the signal.

9. An apparatus according to claim 8, wherein the signal generator includes a digital store storing a signal pattern for at least a part of the signal block, generator means for generating a digital signal by repeatedly using the stored signal pattern, and a digital-to-analogue converter for converting the digital signal to the AC electrical signal.

10. An apparatus according to claim 9, wherein the signal generator and the processor are adapted to operate synchronously.

11. An apparatus according to claim 8, comprising a plurality of Analogue to Digital Converters, each for receiving an electrical signal and for generating a digital voltage signal, wherein the switch is adapted to switch each of the plurality of Analogue to Digital Converters sequentially to measure the voltages to allow simultaneous measurements of the voltages, and the processor is adapted to process the sequentially measured voltages for each of the Analogue to Digital Converters.

12. An apparatus according to claim 11, wherein the processor comprises a digital processing arrangement, and the outputs of the plurality of Analogue to Digital Converters are input into a common multiplexer connected to the processor.

13. An apparatus according to claim 6, wherein the delamination sensor is adapted to generate an output as a measure of impedance or at least one component of the impedance of the sensor winding.

14. An apparatus according to claim 13, wherein the delamination sensor is adapted to determine delamination of the laminated structure dependent on the measure of impedance or at least one component of the impedance of the sensor winding is above or below a threshold.

15. An apparatus according to claim 1, wherein the delamination sensor comprises:
   a sensor winding coupled to the transformer core, the sensor winding having a first end and a second end, the sensor winding for sensing a change in the magnetic flux density in the transformer core;

an AC voltage source connected to the first end of the sensor winding for generating a square wave AC electrical signal for application to the sensor winding;

an AC voltage sensor coupled to the first or second end of the sensor winding for detecting an AC voltage on the sensor winding; and an AC current sensor coupled to the first or second end of the sensor winding for detecting an AC current in the sensor winding.

16. An apparatus according to claim 15, wherein delamination of the laminated structure is detected when the delamination sensor detects a change in the AC voltage or AC current.

17. An apparatus according to claim 16, wherein the detected AC voltage on the sensor winding is low-pass filtered, and wherein delamination of the laminated structure is detected when the delamination sensor detects a change in a low-pass filtered AC voltage that is greater than a threshold change.

18. An apparatus according to claim 16, wherein the AC voltage source is a bipolar excitation source whose polarity is reversed when the AC current in the sensor winding reaches a threshold value, and wherein delamination of the laminated structure is detected when the delamination sensor detects a change in the frequency of the AC voltage on the sensor winding that is greater than a threshold change.

19. An apparatus according to claim 1, wherein the transformer core is a transformer core having a relative permeability that is greater than 1000, and/or wherein the transformer core is a toroidal transformer core.

20. An apparatus according to claim 1, wherein for two or more heaters, each of the two or more heaters comprises a return wire, and each of the return wires pass through the transformer core.

21. A method of detecting delamination in a laminated structure, the method comprising:

arranging one or more heaters to be mechanically and thermally connected to the laminated structure between first and second ground layers within the laminated structure, providing a controller electrically coupled to the one or more heaters via source and return wires, the controller being configured to supply the one or more heaters with a DC current through the source and return wires to heat the one or more heaters;

arranging the source and return wires of the one or more heaters to pass through a magnetically saturable closed loop transformer core;

supplying one or more heaters with a DC current through the source and return wires to heat the one or more heaters;

coupling a delamination sensor to the transformer core for detecting a DC current imbalance in the source and return wires; and using the delamination sensor to detect delamination in the laminated structure by detecting a DC current imbalance in the source and return wires.

\* \* \* \* \*